United States Patent
Peh et al.

(10) Patent No.: US 6,682,331 B1
(45) Date of Patent: Jan. 27, 2004

(54) MOLDING APPARATUS FOR MOLDING LIGHT EMITTING DIODE LAMPS

(75) Inventors: Thomas Kheng Guan Peh, Penang (MY); Chien Chai Lye, Penang (MY)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/247,965

(22) Filed: Sep. 20, 2002

(51) Int. Cl.[7] .................. B29C 45/14; B29C 70/72; H01L 21/56
(52) U.S. Cl. .................. 425/112; 425/120; 425/127; 425/588
(58) Field of Search .................. 425/112, 127, 425/120, 572, 588

(56) References Cited

U.S. PATENT DOCUMENTS

| | | | | |
|---|---|---|---|---|
| 3,875,456 A | * | 4/1975 | Kano et al. .................. | 313/501 |
| 4,305,204 A | * | 12/1981 | Toggart et al. .................. | 29/841 |
| 4,890,383 A | * | 1/1990 | Lumbard et al. .................. | 438/27 |
| 5,098,630 A | * | 3/1992 | Ogiu et al. .................. | 425/117 |
| 5,344,600 A | * | 9/1994 | McShane et al. .................. | 425/190 |
| 5,793,118 A | * | 8/1998 | Nakajima .................. | 257/790 |
| 5,959,316 A | * | 9/1999 | Lowery .................. | 257/98 |
| 6,033,202 A | * | 3/2000 | Bao et al. .................. | 425/120 |
| 6,252,254 B1 | * | 6/2001 | Soules et al. .................. | 257/89 |

FOREIGN PATENT DOCUMENTS

| | | | | |
|---|---|---|---|---|
| JP | 58151035 A | * | 9/1983 | .................. H01L/21/56 |
| JP | 59181024 A | * | 10/1984 | .................. H01L/21/56 |
| JP | 03102841 A | * | 4/1991 | .................. H01L/21/56 |
| JP | 04173117 A | * | 6/1992 | .................. B29C/45/02 |
| JP | 10022422 A | * | 1/1998 | .................. H01L/21/56 |

* cited by examiner

*Primary Examiner*—Robert Davis (57) ABSTRACT

The present invention provides a method and system for molding light emitting diode (LED) lamps. A mold frame is provided around each LED chip in an array. A first mold insert is placed in the mold frame and light converting material comprising a carrier and light converting particles is injected into the first mold insert to form a light converting molding around each LED chip. The first mold insert is removed. A second mold insert is placed in the mold frame and lens material is injected into the first mold insert to form a lens molding around the light converting molding for each LED chip.

4 Claims, 6 Drawing Sheets

MOLDING APPARATUS FOR MOLDING LIGHT EMITTING DIODE LAMPS

TECHNICAL FIELD

The technical field of this disclosure is semiconductor manufacturing methods, particularly, a method for molding light emitting diode lamps.

BACKGROUND OF THE INVENTION

Recent improvements in lighting technology have developed white solid-state lamp technology based on the use of ultraviolet and blue GaN/InGaN light-emitting diodes (LEDs). This technology offers the exciting potential of highly efficient low voltage lighting sources that are rugged, highly reliable, and inexpensive. For highly industrial countries, the potential energy savings are very significant. In the U.S., about 20% of all electricity and about 7.2% of all energy is used for lighting. Energy savings also can result in environmental improvements by lowering the emissions from coal or oil fired power plants. Low voltage solid-state lighting also offers the opportunity to take advantage of local power sources, reducing the need for expensive power grids. Low voltage solid-state lighting offers a wide range of new lighting sources and products, including distributed panel lighting, conformable lighting systems, and intelligent lighting schemes.

A white solid-state lamp can be obtained by coating a conventional light-emitting diode with a phosphorescent material, such as coating LEDs of GaN/InGaN-based epitaxial structures with phosphor. The phosphor absorbs the diode emission of blue or UV light and re-emits a broad band of yellow-green or red and green light. The re-emitted light combines with the original unabsorbed blue light to produce a white light.

The commercial technique typically employed in phosphor deposition on LEDs involves the use of phosphor powders blended in a liquid polymer system, such as epoxy resin, polypropylene, polycarbonate, or silicone. Generally, a small amount of the phosphor-impregnated epoxy is painted or dispensed on the LED die, then dried or cured. A clear epoxy lens is then constructed around the die, although the phosphor-impregnated epoxy can be used to construct the whole LED lens. Other techniques have also included dusting phosphor powders or spray painting phosphor powder liquid mixtures directly on the LED die.

Figure 1A:
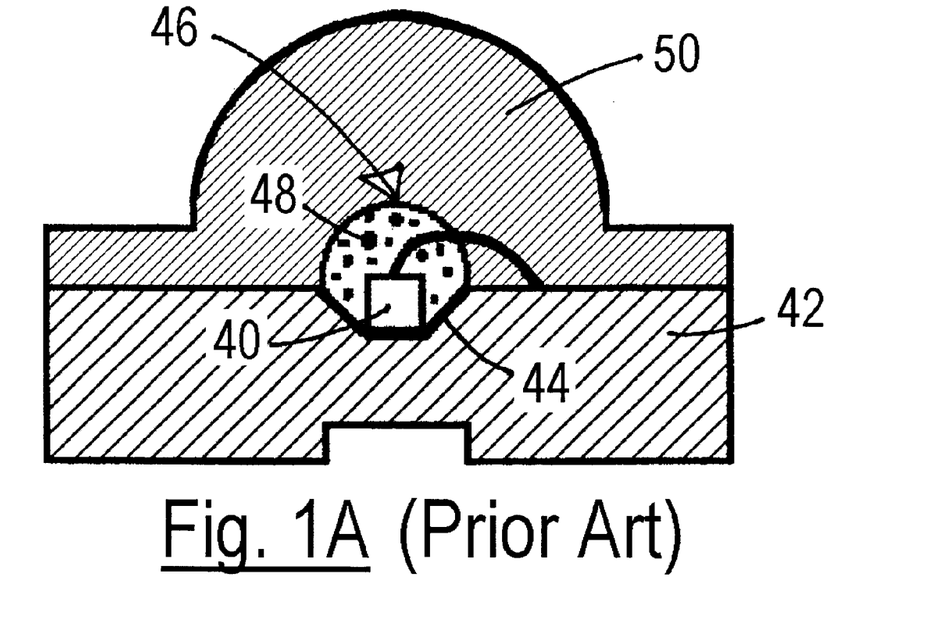
FIGS. 1A & 1B show schematic diagrams of a typical surface mount technology white light LED lamps.
Figure 1B:
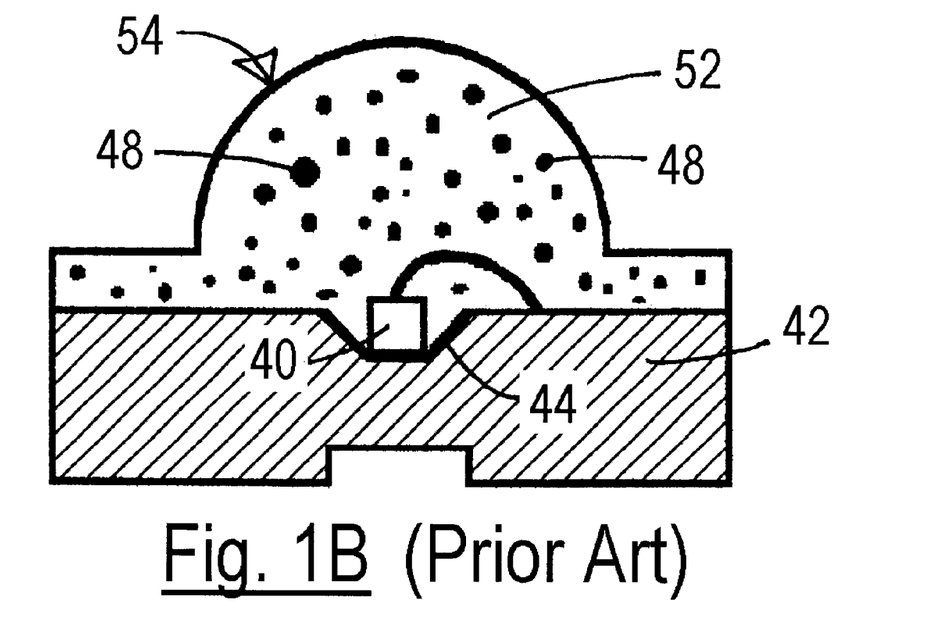

FIGS. 1A & 1B show schematic diagrams of a typical surface mount technology (SMT) white light LED lamps. FIG. 1A shows an SMT LED lamp manufactured by a pre-dip process. The LED chip 40 is disposed on and electrically connected to metal contact base 42 having a reflector cup 44. A phosphor epoxy coating 46 containing phosphor particles 48 fills the reflector cup 44 and covers the LED chip 40. An epoxy lens 50 is molded over the phosphor epoxy coating 46. The phosphor epoxy coating 46 is often irregular because it is dropped or painted onto the LED chip 40. Although the phosphor epoxy coating 46 is disposed close to the LED chip 40 for efficient light production and the epoxy lens 50 can be clear so as not to interfere with light transmission, variability of phosphor concentration and geometry in the phosphor epoxy coating 46 causes color and light transmission inconsistencies between different LED lamps.

FIG. 1B, in which like elements share like reference numbers with FIG. 1A, shows an SMT LED lamp manufactured by a pre-mix process. Phosphor epoxy lens 52 containing phosphor particles 48 fills the reflector cup 44, covers the LED chip 40, and forms an optical dome 54. Although the large volume of the optical dome 54 produces consistent color, the disposition of the phosphor particles 48 throughout the whole phosphor epoxy lens 52 interferes with the light transmission making the LED lamp inefficient.

Current phosphor deposition methods are inefficient in production and less than optimum in result. The resulting white solid-state lamps may lack color repeatability and uniformity, so as to be unsuitable for color-critical applications. The lamps are inefficient and convert less of the chip radiation into visible light than possible due to phosphor placement away from the light emitting diode, and absorption and reflection in binder materials. In addition, the current phosphor deposition methods are difficult to translate into mass production for coating many single diodes and for coating large arrays of diodes mounted on circuit or ceramic boards.

It would be desirable to have a method for molding light emitting diode lamps that would overcome the above disadvantages.

SUMMARY OF THE INVENTION

The present invention allows efficient, cost effective manufacturing of LED lamps by producing arrays of LED lamps in a single batch. The present invention also produces a better, more efficient LED lamp with consistent color and light transmission. The molding process controls the shape and mixture consistency of the phosphorescent material and controls the lens shape for the desired light transmission characteristics.

One aspect of the present invention provides a method for molding light emitting diode lamps by providing a light emitting diode (LED) chip and a first mold insert. The first mold insert defines a first mold void, which is located about the LED chip. Light converting material is injected into the first mold void and the first mold insert is then removed from about the LED chip. A second mold insert defining a second mold void is provided, and the second mold insert located about the light converting material. Lens material is injected into the second mold void.

Another aspect of the present invention provides a system for molding light emitting diode lamps. The system comprises a mold frame, a first mold insert locatable in the mold frame and defining first mold voids locatable about the LED chips, a second mold insert locatable in the mold frame and defining second mold voids, and an injector to inject light converting material into the first mold voids and to inject lens material into the second mold voids.

One aspect of the present invention provides a method for molding light emitting diode lamps by providing light emitting diode (LED) chips and first mold inserts. The first mold insert defines first mold voids and the first mold voids are connected by first runners. The first mold voids are located about the LED chips and light converting material is injected into them. The light converting material forms light converting moldings on the LED chips and forms first runner trails in the first runners. The first mold insert is removed from about the LED chips. A second mold insert is provided. The second mold insert defines second mold voids locatable over the light converting moldings. The second mold voids are connected by second runners locatable over the first runner trails. The second mold voids are located about the light converting moldings and lens material is injected into them.

The foregoing and other features and advantages of the invention will become further apparent from the following detailed description of the presently preferred embodiments, read in conjunction with the accompanying drawings. The detailed description and drawings are merely illustrative of the invention, rather than limiting the scope of the invention being defined by the appended claims and equivalents thereof.

DETAILED DESCRIPTION OF THE PRESENTLY PREFERRED EMBODIMENT

The present invention provides a method and system for molding light emitting diode (LED) lamps. A mold frame is provided around each LED chip in an array. A first mold insert is placed in the mold frame and a light converting material comprising a carrier and light converting particles is injected into the first mold insert to form a light converting molding around each LED chip. The first mold insert is removed. A second mold insert is placed in the mold frame and a lens material is injected into the first mold insert to form a lens molding around the light converting molding for each LED chip. Runners connect mold voids in the mold inserts so that the material reaches all the LED chip locations with each injection. The array of LED lamps is separated into individual units or maintained as a single array.

Figure 2A:
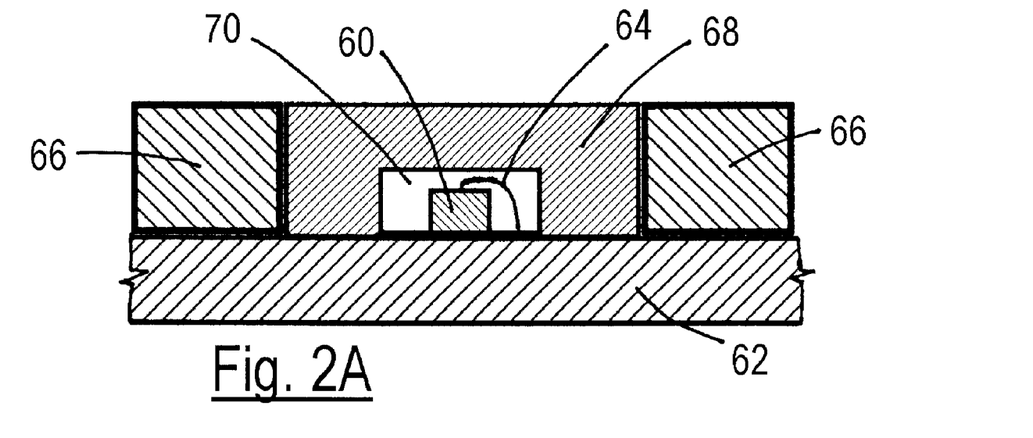
FIGS. 2A & 2B show cross-sectional views that illustrate a method for molding light emitting diode lamps according to the present invention.
Figure 2B:
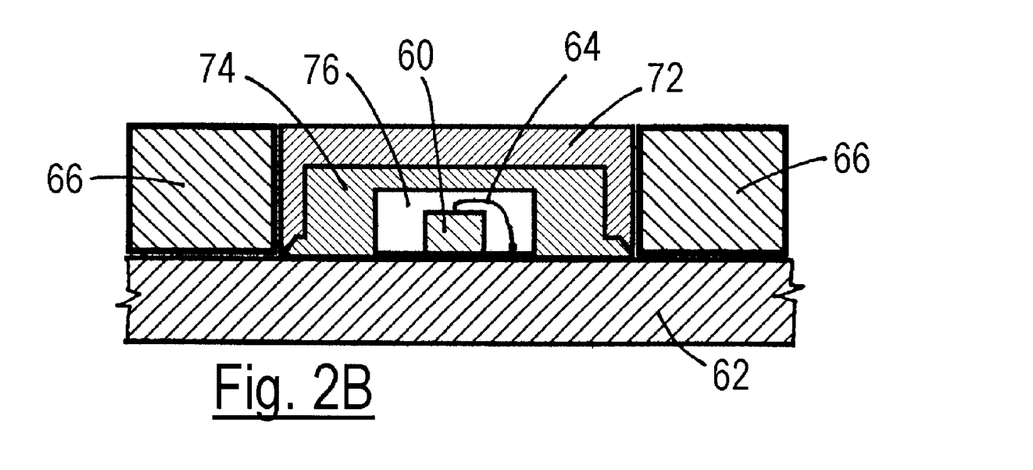

FIGS. 2A & 2B show cross-sectional views that illustrate a method for molding light emitting diode lamps according to the present invention.

Referring to FIG. 2A, a light emitting diode (LED) chip 60 is disposed on a printed circuit board 62 and electrically connected by wire 64. A mold frame 66 about the LED chip 60 provides alignment of the mold inserts for each molding operation. A first mold insert 68 having a first mold void 70 is placed in the mold frame 66, which locates the first mold void 70 about the LED chip 60. A light converting material is injected into the first mold void 70 through first runners (not shown) to fill the first mold void 70. The light converting material comprises a carrier including light converting particles. The light converting material in the first mold void 70 is cured into a light converting molding, and the first mold insert 68 removed from the mold frame 66. The precisely defined geometry and precisely defined mixture of the light converting molding provides efficient conversion of the light from the LED chip 60.

Referring to FIG. 2B, a second mold insert 72 having a second mold void 74 is placed in the mold frame 66. The mold frame locates the second mold void 74 about the light converting molding 76. A lens material is injected into the second mold void 74 through second runners (not shown) to fill the second mold void 74. The lens material in the second mold void 74 is cured into a lens molding, and the second mold insert 72 removed from the mold frame 66. The LED lamps, comprising the LED chip connected to the PCB, the light converting molding, and the lens molding, are typically separated into individual LED lamps, but alternatively are maintained together on the PCB to form an array of LED lamps in a desired pattern.

The LED chip 60 is any light emitting semiconducting device responsive to an electrical signal and emitting light within the ultraviolet (UV) to infrared (IR) spectrum. Examples of LED chips are GaN, InGaN, AlInGaP, GaP, or any device capable of performing the stated function of emitting light in response to an electrical signal.

The light converting material comprises a carrier including light converting particles or material. The carrier is typically a material which, when cured into the light converting molding, provides high transitivity to allow the light emitted from the LED chip 60 to pass through and to allow the light emitted from the light converting particles to escape. In other embodiments the light converting material contains reflecting bodies, diffusing bodies, colored dyes, pigments, or combinations thereof, to achieve the particular effect desired. The carrier is typically a transparent molding epoxy, although in other embodiments the carrier is another liquid polymer system, such as polypropylene, polycarbonate, silicone, or any material that performs the function of forming a light converting molding suspending a phosphorescent material.

The mixing of the carrier and the light converting particles is typically controlled to an accuracy of plus or minus 0.01 weight percent, although in other embodiments less accuracy is required. Mixtures of epoxy and phosphor premixed to a high degree of accuracy are custom ordered pre-mixed from outside suppliers or can be mixed as part of the molding process. In one embodiment, the mixing of the light converting material is carried out in a mixer, which is any device capable of performing the function of mixing of the carrier and the light converting particles. Precisely defined mixing, uniform mixing of the light converting material provides an efficient light converting molding. The light emitted from the LED chip 60 is absorbed by the light converting particles to the extent desired and the re-emitted light from the light converting particles is emitted uniformly from the light converting molding.

The light converting particles in the light converting material are any particles capable of receiving light emitted from the LED chip 60 and re-emitting the light at another wavelength. Examples include phosphor particles, such as yellow or yellow/green phosphors, red phosphors, green phosphors, blue phosphors, and combinations thereof As used herein, phosphors are named by the color light they emit, e.g., a green phosphor emits green light. Yellow or yellow/green phosphors include $Y_3Al_5O_{12}:Ce^{3+}$; YAG:Ce, Pr; $(Tb_{1-x}Ce_x)_3Al_5O_{12}$. Red phosphors include $SrS:Eu^{2+}$; $(Ca,Sr)S:Eu^{2+}$; and $YVO_4:Eu^{3+},Bi^{3+}$. Green phosphors include $(Sr,Ca,Ba)(Al,Ga)_2S_4:Eu^{2+}$; and $BaMgAl_{10}O_{17}:Eu^{2+},Mn^{2+}$. Blue phosphors include $BaMg_2Al_{16}O_{27}:Eu^{2+}$.

Selection of the LED chip emission wavelength and phosphor emission spectrum allows generation of any color spectrum desired. Various combinations of LED chips and phosphors are used to produce the desired color of light. In one embodiment, the LED chip emits a first light in the range from UV to red, a single phosphor receives the first light, and the single phosphor emits a second light in the desired color. For example, a UV LED chip and a light converting material with a red phosphor are used to produce a red light.

In another embodiment, the LED chip emits a first light, a single phosphor receives the first light, and the single phosphor emits a second light. The first light and the second light are perceived as the desired color. For example, a blue light emitting LED chip and a yellow phosphor light converting material produce light perceived as white light when the blue light from the LED chip is seen with the yellow light from the phosphor.

In yet another embodiment, the LED chip emits a first light, a phosphor mixture receives the first light, and the phosphor mixture emits a second light at the desired color. For example, a UV LED chip and a light converting material with a mixture of blue, red, and green phosphors are used to produce a white light.

In yet another embodiment, the LED chip emits a first light, a phosphor mixture receives the first light, and the phosphor mixture emits a second light, third light, fourth light, et cetera. The first light, second light, third light, fourth light, et cetera, are perceived as the desired color. For example, a blue light emitting LED chip and a light converting material with a mixture of red and green phosphors are used to produce light perceived as white light when the blue light from the LED chip is seen with the red and green light from the phosphor mixture.

The lens material is typically a material which, when cured into the lens molding, provides high transitivity to allow the light emitted from the light converting molding 76 to pass through. The lens material is typically a transparent molding epoxy, although in other embodiments the carrier is another liquid polymer system, such as polypropylene, polycarbonate, silicone, or any material that performs the function of forming a lens molding allowing transmission of light from the light converting molding. In other embodiments the lens material additionally contains reflecting bodies, diffusing bodies, colored dyes, pigments, or combinations thereof, to achieve the particular effect desired for the lens molding.

Figure 7:
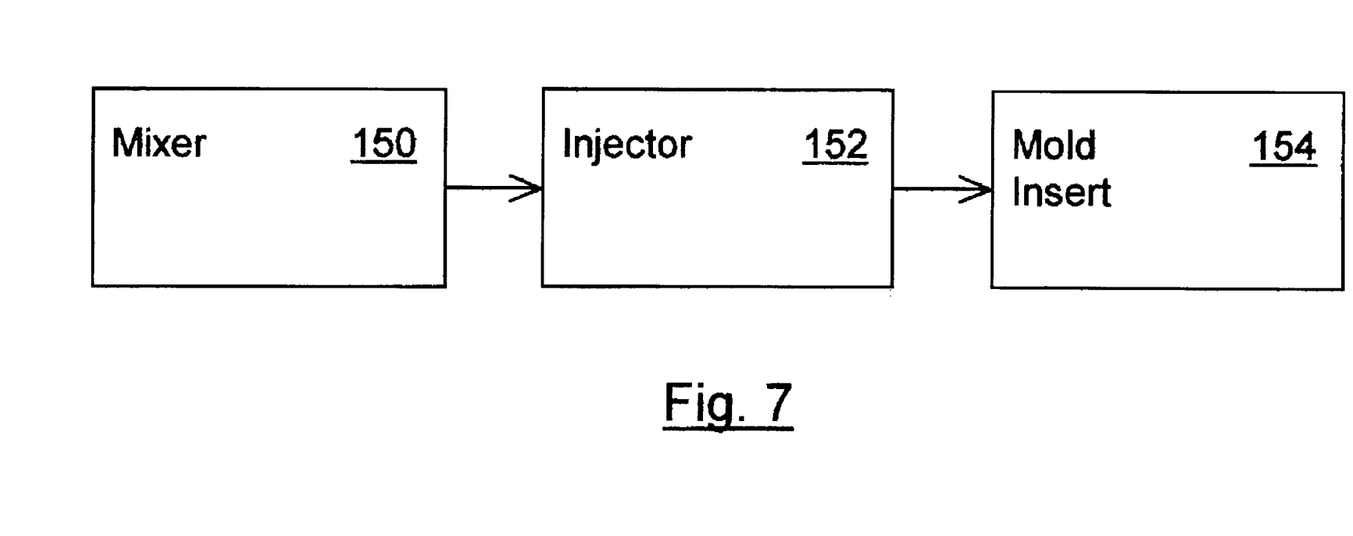
FIG. 7 shows a block diagram of a system for use in a method for molding light emitting diode lamps according to the present invention.

FIG. 7 shows a block diagram of a system for use in a method for molding light emitting diode lamps. A mixer 150 provides material to the injector 152, which injects the material into the mold voids of the mold insert 154. For the light converting material, the mixer 150 mixes the carrier and the light converting particles. The mixer 150 can also mix the carrier components, such as resin and hardener for an epoxy carrier. The mixer 150 can also mix additional components with the light converting material, such as reflecting bodies, diffusing bodies, colored dyes, pigments, or combinations thereof. For the lens material, the mixer 150 can mix the lens material components, such as resin and hardener for an epoxy lens material. The mixer 150 can also mix additional components with the lens material, such as reflecting bodies, diffusing bodies, colored dyes, pigments, or combinations thereof. Different mixers or injectors can be provided for the light converting material and the lens material, as desired, depending on the manufacturing process configuration and the particular materials used.

Figure 3A:
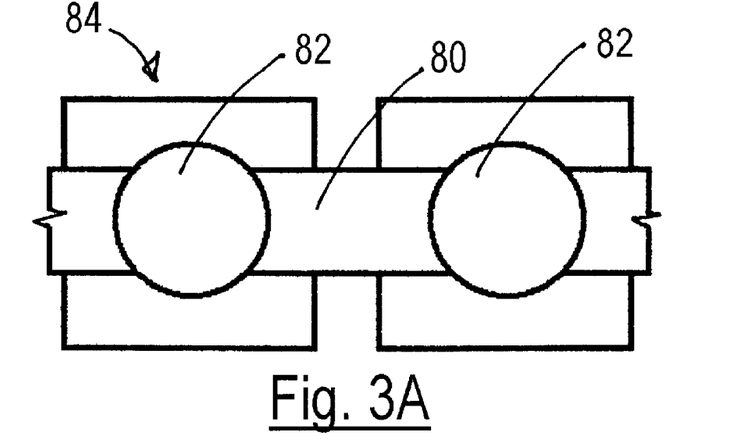
FIGS. 3A & 3B show partial bottom views of a first and second mold insert, respectively, for use in a method for molding light emitting diode lamps according to the present invention.
Figure 3B:
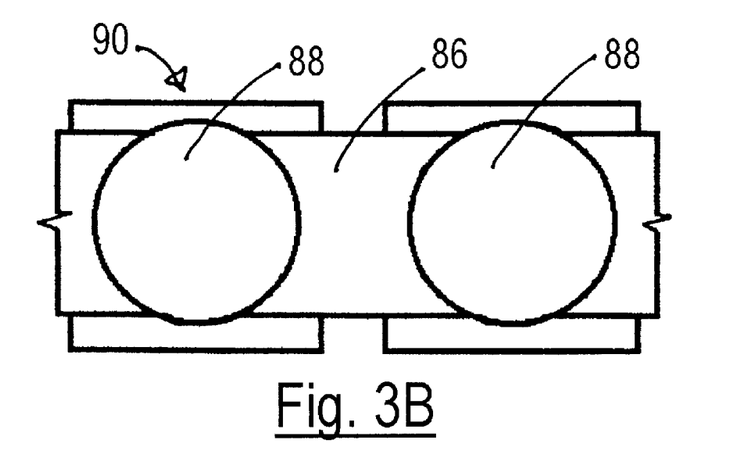

FIGS. 3A & 3B show partial bottom views of a first and second mold insert, respectively, for use in a method for molding light emitting diode lamps according to the present invention. Only a portion of the mold inserts is shown in each figure. Typically, the mold inserts comprise a one-dimensional or two-dimensional array with many mold voids to allow production of a large number of LED lamps in a single batch. Referring to FIG. 3A, a first runner 80 connects the first mold voids 82 in the first mold insert 84. Each of the first mold voids 82 defines the shape of the light converting molding of one LED lamp. In the molding process, the light converting material is injected into the first mold voids 82 through first runner 80 to fill the first mold voids 82. Referring to FIG. 3B, a second runner 86 connects the second mold voids 88 in the second mold insert 90. Each of the second mold voids 88 defines the shape one lens molding of the LED lamp. In the molding process, the lens material is injected into the second mold voids 88 through second runner 86 to fill the second mold voids 88. The material is injected with an injector, which is any device capable of performing the function of injecting the light converting material or lens material into the first mold voids or second mold voids, respectively. In one embodiment, the same injector is used for injecting the light converting material and the lens material.

The second runner 86 is sized to allow flow of the lens material around the first runner trail and into the second mold voids 88 around the light converting moldings. The first runner trail remains from the light converting material that hardened in the first runner. The light converting moldings remain from the light converting material that hardened in the first mold voids. The runner trails are removed in finishing individual LED lamps, but alternatively are left in place in forming an array of LED lamps.

Figure 4A:
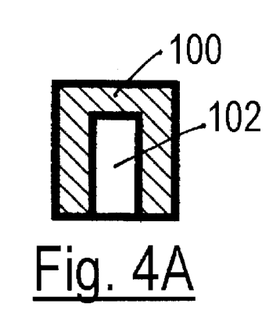
FIGS. 4A & 4B show cross section views of two runner trails produced by a method for molding light emitting diode lamps according to the present invention.
Figure 4B:
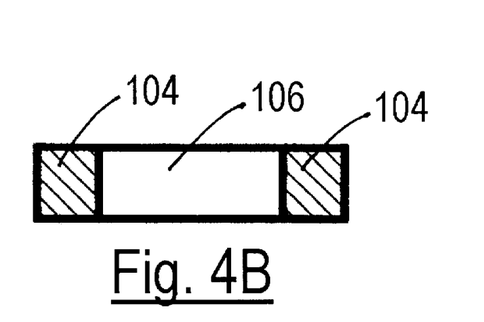

FIGS. 4A & 4B show cross sectional views of two runner trails produced by a method for molding light emitting diode lamps according to the present invention. Referring to FIG. 4A, a second runner trail 100 is continuously disposed about the first runner trail 102. The second runner trail 100 is formed in forming the lens molding of the LED lamp and the first runner trail 102 is formed in forming the light converting molding of the LED lamp. In this embodiment, the second runner is taller and wider than the first runner, so the second runner trail 100 surrounds the first runner trail 102 on three sides. Referring to FIG. 4B, a second runner trail 104 is discontinuously disposed on either side of the first runner trail 106. In this embodiment, the second runner is the same height but wider than the first runner, so the second runner trail 104 is on both sides of the first runner trail 106.

Figure 5A:
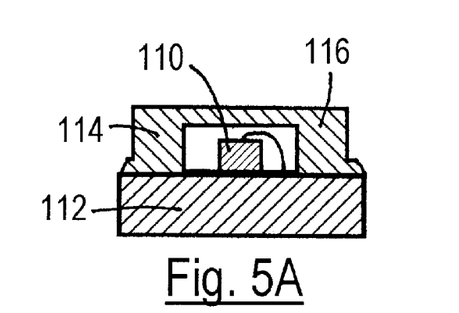
FIGS. 5A–5D show cross section views of typical LED lamps produced by a method for molding light emitting diode lamps according to the present invention.
Figure 5B:
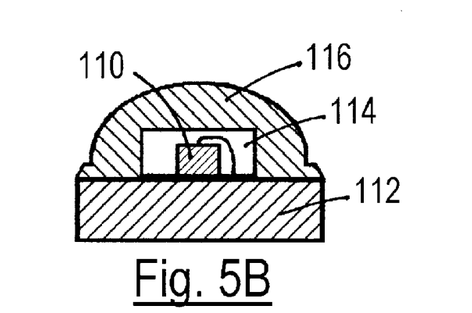
Figure 5C:
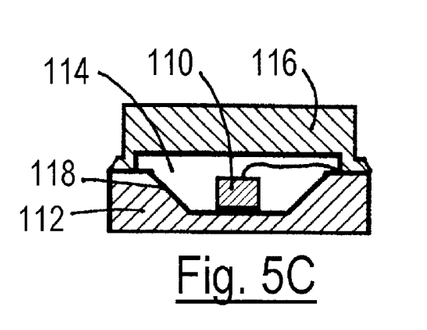
Figure 5D:
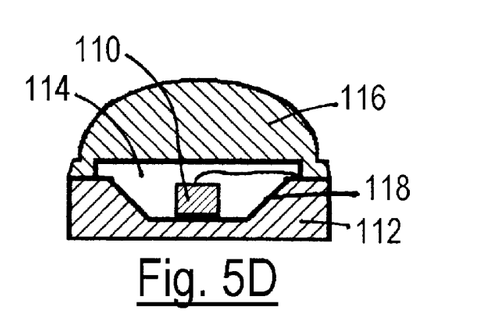

FIGS. 5A–5D, in which like elements have like reference numbers, show cross section views of typical LED lamps produced by a method for molding light emitting diode lamps according to the present invention. The shape of the light converting molding and lens molding depends on the shape of the first and second voids of the first and second mold inserts, respectively. FIG. 5A shows an LED chip 110 surface mounted on a printed circuit board (PCB) 112 with a light converting molding 114 and a lens molding 116, the lens molding 116 having a flat surface parallel to the PCB. FIG. 5B shows an LED chip 110 surface mounted on a PCB 112 with a light converting molding 114 and a lens molding 116, the lens molding 116 having a convex surface with respect to the PCB. FIG. 5C shows an LED chip 110 mounted in a reflector cup 118 of a PCB 112 with a light converting molding 114 and a lens molding 116, the lens molding 116 having a flat surface parallel to the PCB. FIG. 5D shows an LED chip 110 mounted in a reflector cup 118 of a PCB 112 with a light converting molding 114 and a lens molding 116, the lens molding 116 having a convex surface with respect to the PCB. The exemplary LED lamps presented show several PCB configurations and lens molding shapes, although many configurations and combinations are possible.

Figure 6:
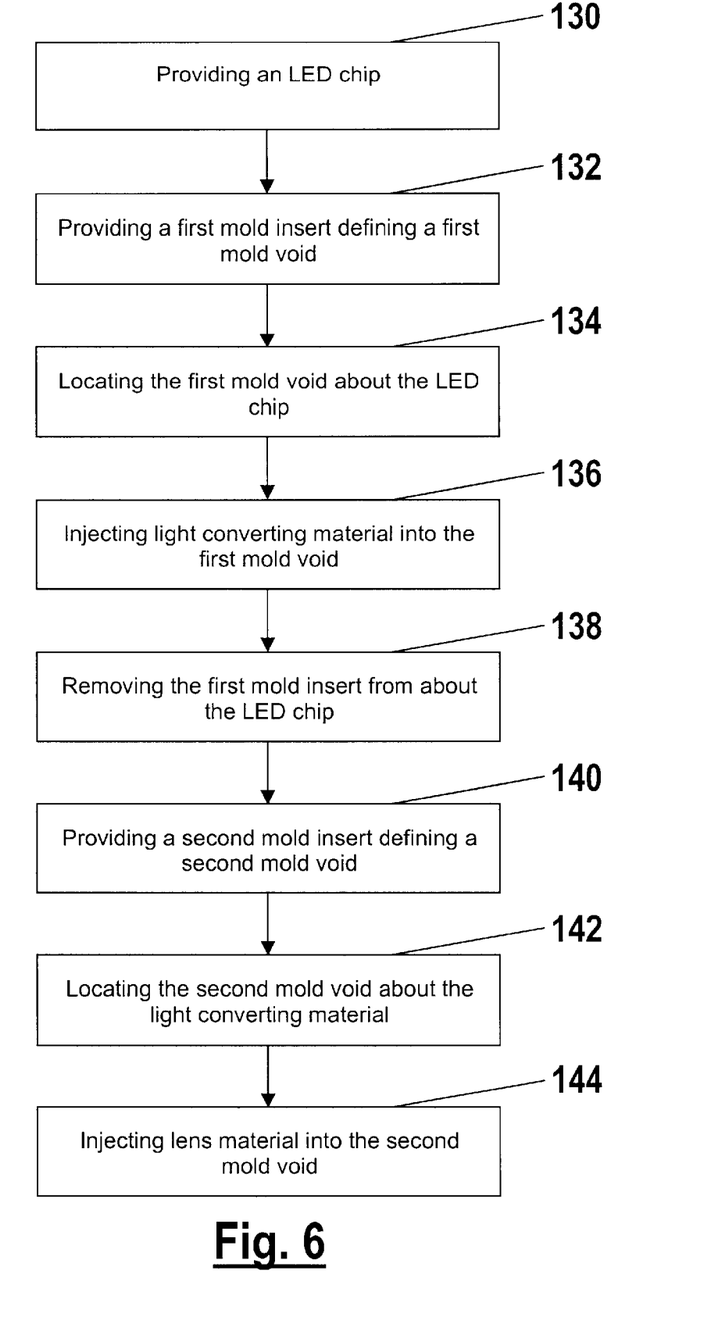
FIG. 6 shows a flow chart of a method for molding light emitting diode lamps according to the present invention.

FIG. 6 shows a flow chart of a method for molding light emitting diode lamps according to the present invention. At 130, an LED chip is provided. At 132, a first mold insert defining a first mold void is provided. Typically, an array of first mold voids connected by first runners is defined by the first mold insert. The first mold void is located about the LED chip 134 and a light converting material is injected into the first mold void 136. The light converting material comprises a carrier and a light converting material. At 138, the first mold insert is removed from about the LED chip. At 140, a second mold insert defining a second mold void is provided. The second mold void is located about the light converting material 142 and a lens material is injected into the second mold void 144. Typically, the location of the mold voids with respect to the LED chips and light converting material is determined by inserting the mold insert in the mold frame.

While the embodiments of the invention disclosed herein are presently considered to be preferred, various changes and modifications can be made without departing from the scope of the invention. For example, in different embodiments, different light converting materials, lens materials, light converting particles, carriers, and phosphors are used: The scope of the invention is indicated in the appended claims, and all changes that come within the meaning and range of equivalents are intended to be embraced therein.

What is claimed is:

1. A system for molding light emitting diode lamps using light emitting diode (LED) chips comprising:

a mold frame;

a first mold insert locatable in the mold frame, the first mold insert defining first mold voids locatable about the LED chips;

a second mold insert locatable in the mold frame, the second mold insert defining second mold voids; and an injector;
      wherein the injector injects light converting material into the first mold voids and injects lens material into the second mold voids.

2. The system of claim 1 further comprising a mixer, the mixer mixing a carrier and light converting particles to form the light converting material.

3. The system of claim 1 wherein the first mold insert further comprises first runners connecting the first mold voids.

4. The system of claim 1 wherein the second mold insert further comprises second runners connecting the second mold voids.

* * * * *